United States Patent
Korus et al.

(10) Patent No.: US 6,755,049 B2
(45) Date of Patent: Jun. 29, 2004

(54) METHOD OF PRODUCING A QUARTZ GLASS CRUCIBLE

(75) Inventors: Gabriele Korus, Leipzig (DE); Hilmar Laudahn, Bitterfeld (DE); Martin Arndt, Bitterfeld (DE); Udo Gertig, Johannesberg (DE)

(73) Assignee: Heraeus Quarzglas GmbH & Co. KG, Hanau (DE)

( * ) Notice: Subject to any disclaimer, the term of this patent is extended or adjusted under 35 U.S.C. 154(b) by 213 days.

(21) Appl. No.: 09/902,473

(22) Filed: Jul. 10, 2001

(65) Prior Publication Data

US 2002/0139143 A1 Oct. 3, 2002

(30) Foreign Application Priority Data

Mar. 8, 2001 (DE) ......................................... 101 11 405

(51) Int. Cl.[7] .............................................. C03B 19/09
(52) U.S. Cl. ......................... 65/17.3; 65/17.5; 65/32.3; 65/33.4; 65/33.6; 65/33.7
(58) Field of Search ................. 65/17.3, 17.5, 65/32.3, 33.4, 33.6, 33.7

(56) References Cited

U.S. PATENT DOCUMENTS

| | | | | |
|---|---|---|---|---|
| 4,102,666 A | * | 7/1978 | Baumler et al. | 65/33.6 |
| 4,473,653 A | * | 9/1984 | Rudoi | 501/4 |
| 4,828,593 A | * | 5/1989 | Morishita et al. | 65/17.6 |
| 4,828,594 A | * | 5/1989 | Morishita et al. | 65/17.6 |
| 5,053,359 A | * | 10/1991 | Loxley et al. | 501/4 |
| 5,389,582 A | * | 2/1995 | Loxley et al. | 501/4 |
| 5,762,672 A | * | 6/1998 | Ikeda et al. | 65/17.3 |
| 5,976,247 A | * | 11/1999 | Hansen et al. | 117/200 |
| 5,980,629 A | * | 11/1999 | Hansen et al. | 117/13 |
| 6,143,073 A | * | 11/2000 | Christman et al. | 117/208 |
| 6,510,707 B2 | * | 1/2003 | Kemmochi et al. | 65/17.3 |

FOREIGN PATENT DOCUMENTS

| | | |
|---|---|---|
| EP | 0 911 429 A1 | 4/1999 |
| WO | WO 02/16677 A1 | 2/2002 |

* cited by examiner

*Primary Examiner*—Sean Vincent
(74) *Attorney, Agent, or Firm*—Tiajoloff & Kelly

(57) ABSTRACT

Known is a method of producing a quartz glass crucible in which a crucible base body is provided at least in part with an inner layer in which the formation of cristobalite is induced by using a crystallization promoter. On the basis thereof, in order to provide an inexpensive method of producing a quartz glass crucible with reproducible characteristics for long service lives, it is suggested according to the invention that the crystallization promoter and a reducing substance are introduced into the inner layer.

20 Claims, No Drawings

METHOD OF PRODUCING A QUARTZ GLASS CRUCIBLE

The present invention relates to a method of producing a quartz glass crucible by providing a crucible base body at least in part with an inner layer in which the formation of cristobalite is induced by using a crystallization promoter.

Such quartz glass crucibles are e.g. used for receiving the metal melt when single crystals are pulled according to the so-called Czochralski method. In this method, a seed crystal with a predetermined direction of orientation is immersed into the melt and then slowly pulled upwards. Seed crystal and melt rotate in opposite directions. The surface tension between seed crystal and melt has the effect that a small amount of melt is also pulled off together with the seed crystal, said melt gradually cooling down, thereby solidifying into the continuously further growing single crystal. In this pulling process the quartz glass crucible is subjected to high mechanical, chemical and thermal stresses that must be withstood by the quartz glass crucible for several hours without any noticeable plastic deformation. In the case of a silicon melt, the melting temperature is e.g. more than 1400° C.

To enhance the thermal stability of the quartz glass crucible, it has therefore been suggested that the crucible should be provided with a surface layer of cristobalite. The melting point of cristobalite is at about 1720° C. Such a method is described in EP-A 748 885. The glassy outer wall of a commercially available crucible of opaque, bubble-containing quartz glass is here treated with a chemical solution containing substances that are conducive to the devitrification of quartz glass into cristobalite. Boron, alkaline-earth and phosphorus compounds are recommended as crystallization-promoting substances (hereinafter also referred to as "crystallization promoters"). Barium hydroxide is preferably used. While the quartz glass crucible is heated up (for instance during the intended use in the pulling process), the pre-treated crucible wall crystallizes under formation of cristobalite, which results in a higher mechanical and thermal strength of the quartz glass crucible.

However, the quartz glass crucibles produced by means of the known method can only withstand long process periods to a certain degree when silicon monocrystals are pulled. The thickness of the crystallized surface layer is normally less than 1 mm and is thus relatively thin. It has been found that after some time the crystallized surface layer starts to detach gradually, with the crystallized surface disintegrating less rapidly than the untreated glassy surface. Cristobalite particles that flake off on account of the bubble growth starting below the thinning cristobalite layer thereby pass into the silicon melt and may lead to dislocations in the silicon monocrystal. That is why the known method has so far not been suited for the production of large quartz glass crucibles which are intended to receive a large melt volume and must therefore withstand long process times according to their intended use and thus strong bubble growth.

Moreover, the crystallization promoter may be abraded during transportation or handling of the quartz glass crucible.

It is therefore the object of the present invention to indicate an inexpensive method of producing quartz glass crucibles with reproducible characteristics for long service lives.

Starting from the above-mentioned method, this object is achieved according to the invention in that the crystallization promoter and a reducing substance are introduced into the inner layer.

When compared with the above-described known method, the method according to the invention shows the following essential differences:

1. The crystallization promoter is introduced into the inner layer. The crystallization promoter is thus contained in the inner layer and has such an effect that upon heating of the quartz glass crucible—e.g. during the intended use—it effects the formation of cristobalite. This is accompanied by the known action of the cristobalite layer, i.e. a solidification of the inner wall and thus an increase in thermal stability and chemical resistance of the crucible. An unintended change in concentration, caused e.g. by abrasion during transportation or handling of the quartz glass crucible, is ruled out.
   Moreover, it is possible with the method of the invention to set a predetermined thickness of the crystallized inner layer in a defined manner through a corresponding distribution and concentration of the crystallization promoter in the inner layer. In particular, a stronger and more stable crystallized layer as compared with the known method is thus obtained in a simple way. Layer thicknesses of several millimeters can be achieved. These withstand bubble growth for a longer period of time.

2. A reducing substance is introduced into the inner layer. At least during introduction into the inner layer the substance develops a reducing effect which, however, may still continue or resume again during the intended use of the quartz glass crucible. This results in a surprising effect with respect to the service life of the quartz glass crucible, which shall be explained in more detail in the following:
   It has been found that during the above-mentioned gradual detachment of the crystallized inner layer the growth of bubbles in the crucible wall is of essential importance to the durability of the crystallized surface. The opaque crucible wall contains a multitude of bubbles in which gases may also be entrapped. On account of the high temperature during use of the crucible and, in particular, in the case of long process times, this results in a growth of gas-containing bubbles, which is facilitated by the low viscosity of the quartz glass at such temperatures. When a growing bubble comes into contact with a thin cristobalite layer; this results in mechanical stresses and local flaking off of the cristobalite layer; this is observed all the earlier the thinner the cristobalite layer is. On the assumption that the bubble growth is considerably influenced by the oxygen formed, the chemical reaction that takes place in this case could be described by the following total reaction equation:

$$4SiO_{2(s)} + C_{(s)} + 2N_{2(g)} \rightarrow Si_3N_{4(s)} + SiC_{(s)} + 4O_{2(g)} \quad (1)$$

s=solid
g=gaseous

Subsequently, with the cooperation of atmospheric nitrogen and carbon which is contained in small amounts in the initial substances or may be charged into the crucible wall during the manufacturing process, each mol of nitrogen forms twice the volume of oxygen.

However, in cases where a reducing substance is present in the inner layer, said substance reacts—at least when charged into the inner layer, but preferably also or again during the pulling process—with oxygen or the introduced nitrogen to form an oxidized solid. The solid does not contribute anything to the total gas volume. Thus this "getter effect" of the reducing substance reduces the formation of bubbles caused by excessive oxygen or by oxygen formed during the pulling process.

According to the invention the reducing substance is produced at least during production of the inner layer so that it develops the above-described bubble-reducing getter effect in the area of the inner wall of the crucible. It is in this area that the reducing substance turns out to be of essential importance, since the flaking off of cristobalite which is caused by the growth of bubbles is thus also avoided and the service life of the quartz glass crucible is thereby prolonged.

The method according to the invention allows, on the one hand, a defined and reproducible formation of cristobalite in the area of the inner wall of the quartz glass crucible and guarantees, on the other hand, that this layer of cristobalite is kept undamaged as much as possible during the intended use of the quartz glass crucible. The quartz glass crucible produced according to the method of the invention therefore withstands long process times. The use of large quartz glass crucibles, which when used must withstand particularly long process times, is made possible by the crystallized inner layer for the first time, and the method according to the invention does here not rule out the additional application of crystallization promoters to the inner layer of the quartz glass crucible.

Preference is given to a variant of the method of the invention in which at least part of the crystallization promoter is simultaneously introduced into the inner layer for forming the reducing substance. The crystallization promoter fulfills both of the above-mentioned functions in that it promotes the formation of cristobalite in the area of the inner wall when the quartz glass crucible is heated up again and, at the same time, contributes to the formation of the reducing substance which reduces the growth of bubbles by way of its "getter effect", thereby ensuring a firm adhesion of the cristobalite layer and thus a long service life of the quartz glass crucible. Either one and the same chemical as an element or in a chemical compound acts here as a crystallization-promoting and bubble-reducing agent at the same time, i.e. simultaneously as a crystallization promoter and as a reducing substance, or a chemical compound is concerned of which one part acts as a crystallization promoter and another part as a reducing substance in the sense of the present invention.

Preferably, such oxygen or nitrogen compounds that are present as a solid up to a temperature of at least 1450° C. are formed by oxidation of the reducing substance. Metals or metallic compounds are primarily suited as reducing substances, but also such chemical compounds that can be introduced into the inner layer in an oxidation stage lower than their highest oxidation stage. Of importance is here that the chemical compounds formed by oxidation of the reducing substance are obtained as solids and do thus not contribute anything to the gas volume within the inner layer and thus to the formation of bubbles.

It has turned out to be of particular advantage when the reducing effect of the substance is adjusted by setting reducing conditions during the preparation of the inner layer. Reducing conditions during the preparation of the inner layer can be set in a particularly simple manner by way of an atmosphere having a reducing action. It is thereby possible to form the reducing substance from an initial substance (chemical compound) which is present in a high or even its highest oxidation stage, on condition that said initial substance is reduced as a consequence of the reducing atmosphere. This is particularly the case with chemical compounds that easily change their oxidation stage and can be reduced by CO, as will be explained in detail in the following.

As for the setting of a reducing atmosphere, it has turned out to be useful to produce the inner layer by way of arc melting using at least one graphite electrode. In the arc melting process, $SiO_2$-containing grains are introduced into an arc and thrown under the action of the arc-producing gas flow against the inner wall of the crucible base body and are molten there. Temperatures of several 1000° C. prevail in the area of the graphite electrode or electrodes so that graphite reacts with oxygen, which predominantly results in the formation of reducing carbon monoxide because of the high temperature (Boudouard equilibrium). The CO formation results in reducing conditions in the preparation of the inner layer. Therefore, initial substances which as such have a reducing effect, as well as initial substances that are reduced under arc-melting conditions are suited for forming the reducing substance in the inner layer.

In consideration of this additional condition, the reducing substance is preferably formed from an initial substance containing one or more of the elements titanium, tungsten, molybdenum, silicon, zirconium or a compound of said elements.

Barium titanate ($BaTiO_3$) or barium zirconate ($BaZrO_3$) is used in a particularly preferred manner as initial substance for the reducing substance in a concentration between 0.003 mol % and 0.02 mol %. The indicated concentration refers to the concentration in the spreading material. Barium titanate or barium zirconate as reducing substances in the sense of the invention help not only to reduce bubbles, but also act as crystallization-promoting agents. Moreover, barium and titanium as well as zirconium are characterized by a relatively small coefficient of distribution in silicon. As for concentrations below said lower limit for the preferred concentration range, a complete crystallization of the inner layer is not achieved. This is true for the case of an inner layer of very pure synthetic $SiO_2$. Impurities in the $SiO_2$ of the inner layer normally promote the formation of cristobalite, so that in the case of contaminated $SiO_2$ a complete crystallization of the inner layer must already be expected at a $BaTiO_3$ or $BaZrO_3$ content of less than 0.003 mol %. The upper limit indicated for the preferred concentration range follows from the fact that the inner layer is gradually dissolved during use of the crucible, so that the substances contained therein pass into the metal melt and may contaminate the same. Particularly preferred is a concentration range for barium titanate or barium zirconate that ranges from 0.005 mol % to 0.01 mol %.

Alternatively or in addition, it has been found that the use of titanium silicide and/or tungsten silicide in a concentration between 0.002 mol % and 0.5 mol % as a reducing substance is of advantage. On account of their silicon content, silicides have less tendency to contaminate a silicon melt. The lower and upper limits indicated for the preferred concentration range follow from the observations explained above with respect to barium titanate. Particularly preferred is a concentration range for titanium silicide and/or tungsten silicide which is between 0.004 mol % and 0.4 mol %.

Apart from this, in particular with respect to a high crystallization-promoting effect coupled with a contamination of the silicon melt that is as low as possible, barium silicides have turned out to be useful as particularly suited reducing substances in the inner layer. However, barium silicides are not stable in moist air and therefore require the use of a protective gas atmosphere.

On the whole, the following metals are in particular expected to be suited as a reducing substance, coupled with a bubble-reducing getter effect: W, Mo, Ba, Ti, Ga, Ge, In, Sn, Tl, Pb, Zr, Si, alkaline-earth metals, rare-earth metals and Fe, and also chemical compounds having a per se reducing effect under the conditions of the crystal pulling process in the form of hydrides, nitrides, silicides. Chemical compounds in the form of oxides, carbonates, titanates, zirconates, tungstates, molybdates, ferrates, cobaltates, nickelates, vanadates, niobates, tantalates and chromates are also suited under the precondition of a reducing atmosphere in the preparation of the inner layer as initial substances for the formation of a reducing substance in the sense of the present invention, as has been explained above. However, oxides or oxidic compounds such as ferrates, tungstates, molybdates, nickelates, vanadates, niobates, tantalates, are also used as reducing substances in an incompletely oxidized form.

Of the above-mentioned chemical compounds, in particular the cations of the alkaline-earth metals and oxides of the rare-earth metals as well as Ti, Al and Zr also exhibit a crystallization-promoting effect in quartz glass.

It was proved to be worthwhile if oxides or oxygen compounds, preferably ferrates, wolframates, molybates, nickelates, vandates, niobates, tantalates in its not completely oxidized form are used as the reducing substance.

The reducing substance can be introduced into the inner layer in solid, liquid or gaseous form. However, it has been found to be of particular advantage when the inner layer is produced by means of $SiO_2$ grains which contain the reducing substance or an initial material for forming the same in the form of a dopant. A particularly homogeneous and, in particular, a defined distribution of the substance within the inner layer is thereby guaranteed. As the dopant, the reducing substance or the initial material therefor may be present in any desired oxidation stage as long as it is ensured that a reducing effect is achieved upon introduction of the substance into the inner layer.

It has also turned out to be useful when several substances which have a reducing effect or promote the formation of cristobalite are introduced into the inner layer in a different chemical composition. A simultaneous optimization with respect to getter effect and cristobalite formation is made easier by the selection and dosage of substances having different effects.

When viewed across the crucible wall and, in particular, over the thickness of the inner layer, the reducing substance can have a homogeneous concentration profile. However, it has been found to be of particular advantage when a concentration gradient of the reducing substance is set in the inner layer. In this case the reducing substance shows a concentration gradient over the inner layer with a concentration preferably increasing from the inside to the outside. Hence, when cristobalite detaches from the inner layer, the amount of reducing substance passing into the metal melt is quite small. Since in the crystal pulling process higher temperatures prevail on the inner wall than in the interior of the crucible wall, a lower concentration of the crystallization promoter (in the form of the reducing substance) is also adequate for the formation of a dense cristobalite layer. On the other hand, the reducing substance develops a stronger "getter effect" in the area of the bubble-containing outer layer of the quartz glass crucible because of its higher concentration in this area.

Preferably, $Al_2O_3$ is used as the crystallization promoter in a concentration between 0.15 and 0.5 mol %, preferably between 0.2 and 0.3 mol %. The concentration of $Al_2O_3$ for adjusting a complete crystallization of the inner layer is surprisingly high, which is due to the low tendency of the inner layer to crystallize on account of its high purity.

The invention shall now be explained in more detail with reference to embodiments:

In a first step of the method, the crucible base body is produced according to the known method. To this end, crystalline grains of natural quartz with a grain size ranging from 90 $\mu m$ to 315 $\mu m$ are purified by means of hot chlorination and filled into a metal form rotating about its longitudinal axis. Under the action of a centrifugal force and with the help of a template, a rotationally symmetrical quartz grain layer of uniform thickness is formed from the bulk material on the inner wall of the metal form.

In a second step of the method, a transparent inner layer is produced on the inner wall of the quartz grain layer by means of the so-called "arc melting" process. To this end high-purity $SiO_2$ grains are spread into the metal form under continuous rotation and are softened by means of an arc which is lowered from above into the metal form, and the grains are thrown against the inner wall of the crucible base body and molten thereon. A maximum temperature of more than 2100° C. is achieved on the inner wall. This results in the formation of a metal front which continues to the outside towards the metal form, and as a result of which the inner layer is molten into a transparent quartz glass and the quartz grain layer is sintered into the crucible base body of opaque quartz glass. The melting process is completed before the melt front reaches the metal form. The arc is ignited under atmospheric conditions (in air) by three graphite electrodes. $CO_2$ and $CO$ are formed due to the burning-off of graphite, and the Boudouard equilibrium is clearly shifted in favor of a $CO$ formation because of the elevated temperatures of several thousand degrees Celsius, so that a reducing atmosphere is obtained in the area of the arc.

A reducing substance and a crystallization promoter within the meaning of the present invention are here introduced into the inner layer. The preparation of the inner layer and the introduction of the crystallization promoter and of the reducing substance shall now be explained in the following with reference to embodiments:

EXAMPLE 1

$SiO_2$ grains are mixed with 0.1% b wt. of an $Fe_2O_3$ powder and a transparent inner layer is produced on an opaque crucible base body from the mixture by means of the so-called "spreading method" using an arc. The inner layer extends over the whole crucible base body and has a thickness of 2 mm.

The inner layer produced in this way was then subjected to a so-called "vacuum bake test" with simulation of the pressure and temperature conditions during the crystal pulling process. This sample was compared with a comparative sample in which the inner layer was molten by using an arc, but without adding a dopant. In comparison with said sample, a considerably reduced bubble growth was observed in the case of the $Fe_2O_3$-doped inner layer in the area of the inner layer while the surface of the inner layer showed a cristobalite formation.

Similar tests were performed with the substances indicated in column 1 of Table 1. The concentration of said substances in the inner layer showed a homogeneous distribution in each case and was normally 0.1 mol %. Whenever concentrations with a different concentration range turned out to be useful for adjusting the bubble-reducing or crystallization-promoting effect, said range has been indicated for the respective substance in brackets in Table 1.

TABLE 1

"Initial substances for forming reducing substances and crystallization promoters"

| | Effect | |
|---|---|---|
| Substance/compound | Bubble reduction | Cristobalite formation |
| W | yes | no |
| Mo | yes | no |
| $WSi_2$ | yes (0.002–0.5 mol %) | no |
| $TiSi_2$ | yes (0.002–0.5 mol %) | no |
| $BaCO_3$ | no bubble growth detectable | yes (0.003–0.02 mol %) |
| $BATiO_3$ | | yes (0.003–0.02 mol %) |
| $BaZrO_3$ | | yes (0.003–0.02 mol %) |
| $BaWO_4$ | | yes (0.003–0.02 mol %) |
| $Ti_2O_3$ | yes | small |
| $TiO_2$ | yes | |
| $Al_2O_3$ | no | yes (0.15 to 0.5 mol %) |
| $ZrO_2$ | no bubble growth detectable | yes |

The addition of $Al_2O_3$ just effects the formation of cristobalite in the area of the inner layer, but does not effect a reduction of the bubble growth.

Hence, this substance is only suited for carrying out the method of the invention in combination with a reducing substance. The concentration of $Al_2O_3$ for setting a complete crystallization is surprisingly high; the particularly preferred concentration range is here between 0.2 and 0.3 mol %. This is due to the high purity of the $SiO_2$ grains used.

The metals tungsten and molybdenum and their metallic compounds ($WSi_2$) mentioned in Table 1 show a considerable bubble-reducing effect whereas a crystallization-promoting effect is here missing. These substances are thus only suited in combination with a suitable crystallization promoter for performing the method of the invention. As for molybdenum, it should be noted that some oxide compounds of said metal with a high oxidation stage (in particular $MoO_3$) are volatile at comparatively low temperatures and can have a disadvantageous effect on bubble reduction. However, it can easily be guaranteed under reducing conditions that metallic molybdenum passes into the inner layer upon the oxidation of which such oxides or nitrides are formed that are solid at the temperature of the silicon melt.

Upon introduction of $TiO_2$ under the reducing conditions of arc melting, a bubble-reducing effect was observed that is due to the formation of suboxides of $TiO_2$. Moreover, there is a slight formation of cristobalite, but it can be expected that this formation can be intensified by way of increased $TiO_2$ doping when the inner layer is formed.

EXAMPLE 2

$SiO_2$ grains are mixed with 0.5% by wt. of a $BaTiO_3$ powder for producing an inner layer in a quartz glass crucible, and a transparent inner layer is produced from the mixture, as described in Example 1 with reference to $SiO_2$ grains, by means of the so-called "spreading method" using an arc. This inner layer also extends over the whole crucible base body and has a thickness of 3 mm.

The inner layer produced in this way was subjected to a crystallization test with simulation of the temperature conditions of the melting phase at the beginning of crystal growing. A very pronounced crystallization of the inner layer was observed, which made the determination of the effect on bubble growth more difficult. Insofar as a measurement was possible under these conditions, there was no substantial bubble growth. The concentration of $BaTiO_3$, however, turned out to be unnecessarily high.

EXAMPLE 3

Therefore, in a further test for producing an inner layer in a quartz glass crucible, the $SiO_2$ grains used were only mixed with 0.01 mol % (about 0.05% by wt.) of a $BaTiO_3$ powder, and a transparent layer was produced from the mixture, as described in Example 2 with reference to $SiO_2$ grains, by way of the so-called "spreading method" using an arc. This inner layer also extends over the whole crucible base body and has a thickness of 3 mm.

The inner layer produced in this way was subjected to a crystallization test. An almost comparable crystallization of the inner layer was found, which under qualitative aspects could be classified as optimum.

EXAMPLE 4

For the preparation of an inner layer in a quartz glass crucible, $SiO_2$ grains were mixed with 0.005 mol % of a $BaWO_4$ powder, and a transparent inner layer was produced from the mixture, as described in Example 1 with reference to $SiO_2$ grains, by means of the so-called "spreading method" using an arc. This inner layer also extends over the whole crucible base body and has a thickness of 3 mm.

The inner layer produced in this way was subjected to a crystallization test. A comparable crystallization of the inner layer as in Example 3 was detected. A considerably smaller bubble growth was observed than in the comparative example.

EXAMPLE 5

For the preparation of an inner layer in a quartz glass crucible, $SiO_2$ grains are mixed with 0.01 mol % of a $TiSi_2$ powder, and a transparent inner layer was produced from the mixture, as described in Example 1 with reference to $SiO_2$ grains, by means of the so-called "spreading method" using an arc. This layer also extends over the whole crucible base body and has a thickness of 3 mm.

The inner layer produced in this way was subjected to a "vacuum bake test". A distinct decrease in bubble growth was observed.

What is claimed is:

1. A method of producing a quartz glass crucible, said method comprising:
   preparing a crucible body being configured such that the resulting crucible is adapted to receive therein a melt used in a crystal culling process, said crucible body having a concavity with an inner layer that forms an innermost layer of the resulting crucible that, when said melt is received in the crucible, is in contact with the melt, and in at least a portion of the inner layer the formation of cristobalite is induced using a crystallization promoter,
   said preparing including introducing said crystallization promoter and a reducing substance into said inner layer, said reducing substance being a substance capable of reacting during the crystal pulling process with gaseous oxygen to produce an oxidized solid.
2. The method according to claim 1, wherein said reducing substance is formed from at least part of said crystallization promoter.

3. The method according to claim 1, wherein an oxygen or nitrogen compound in the inner layer is formed by oxidation of said reducing substance, and said compound is a solid up to a temperature of at least 1450° C.

4. The method according to claim 1, wherein said reducing substance has a reducing action that is adjusted by reducing conditions provided during preparation of said inner layer.

5. The method according to claim 4, wherein said inner layer is produced by arc melting using at least one graphite electrode.

6. The method according to claim 2, wherein said reducing substance has a reducing action that is adjusted by reducing conditions provided during preparation of said inner layer.

7. The method according to claim 2, wherein said reducing substance is formed from an initial substance which contains one or more of the elements titanium, tungsten, molybdenum, silicon, zirconium or a compound of one or more of said elements.

8. The method according to claim 2, wherein said reducing substance is formed from an initial substance which contains one or more of the elements titanium, tungsten, molybdenum, silicon, zirconium or a compound of one or more of said elements.

9. The method according to claim 3, wherein said reducing substance is formed from an initial substance which contains one or more of the elements titanium, tungsten, molybdenum, silicon, zirconium or a compound of one or more of said elements.

10. The method according to claim 4, wherein said reducing substance is formed from an initial substance which contains one or more of the elements titanium, tungsten, molybdenum, silicon, zirconium or a compound of one or more of said elements.

11. The method according to claim 1, wherein said reducing substance is formed from an initial substance which contains an alkaline-earth metal compound containing one or more of the elements titanium, tungsten, molybdenum, silicon, or zirconium.

12. A method of producing a quartz glass crucible, said method comprising:

preparing a crucible body having a concavity with an inner layer in which in at least a portion thereof the formation of cristobalite is induced using a crystallization promoter, said preparing including introducing said crystallization promoter and a reducing substance into said inner layer; and wherein said reducing substance is formed from an initial substance which contains one or more of the elements titanium, tungsten, molybdenum, silicon, zirconium or a compound of one or more of said elements; and wherein the initial substance for the reducing substance contains barium titanate or barium zirconate in a concentration between 0.003 mol % and 0.02 mol % in a spreading material.

13. The method according to claim 12, wherein the barium titanate or barium zirconate is present in the spreading material in a concentration between 0.005 mol % and 0.01 mol %.

14. A method of producing a quartz glass crucible, said method comprising:

preparing a crucible body having a concavity with an inner layer in which in at least a portion thereof the formation of cristobalite is induced using a crystallization promoter, said preparing including introducing said crystallization promoter and a reducing substance into said inner layer; and wherein said reducing substance is formed from an initial substance which contains one or more of the elements titanium, tungsten, molybdenum, silicon, zirconium or a compound of one or more of said elements; and wherein the reducing substance contains at least one of titanium silicide and tungsten silicide present in a concentration between 0.002 mol % and 0.5 mol %.

15. The method according to claim 14, wherein the titanium silicide or tungsten suicide is present in a concentration between 0.004 mol % and 0.4 mol %.

16. The method according to claim 1, wherein said inner layer is produced using $SiO_2$ grains which contain said reducing substance or which contain a feed material for forming said reducing substance as a dopant.

17. The method according to claim 1, wherein at least one further reducing substance of a different chemical composition from the first reducing substance are introduced into said inner layer at the same time.

18. The method according to claim 1, wherein a concentration gradient of said reducing substance is set in said inner layer.

19. The method according to claim 1, wherein said crystallization promoter comprises $Al_2O_3$ present in a concentration between 0.15 and 0.5 mol %.

20. The method according to claim 1, wherein said crystallization promoter comprises $Al_2O_3$ present in a concentration between 0.2 and 0.3 mol %.

* * * * *